US006816198B1

(12) United States Patent
Suzuki

(10) Patent No.: US 6,816,198 B1
(45) Date of Patent: Nov. 9, 2004

(54) LIGHT-ELECTRICITY CONVERTING APPARATUS USING NON-VOLATILE MEMORY AND IMAGE APPARATUS USING THE SAME

(75) Inventor: Keisuke Suzuki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 663 days.

(21) Appl. No.: 09/676,528

(22) Filed: Oct. 2, 2000

(30) Foreign Application Priority Data

Oct. 1, 1999 (JP) ........................................ P11-281946

(51) Int. Cl.[7] ................................................ H04N 5/335
(52) U.S. Cl. ....................................... 348/294; 257/291
(58) Field of Search ................................ 348/294, 307, 348/308, 309, 310; 257/81, 82, 291, 292, 316, 461

(56) References Cited

U.S. PATENT DOCUMENTS 4,496,981 A * 1/1985 Ota ............................ 348/294
4,583,122 A * 4/1986 Ohwada et al. ............. 348/792
5,881,327 A * 3/1999 Yoshida ...................... 396/207
6,008,576 A * 12/1999 Nakatani et al. ............ 313/495
6,141,492 A * 10/2000 Hori ........................... 386/112
6,169,532 B1 * 1/2001 Sumi et al. ................... 345/98
6,490,692 B1 * 12/2002 Nomura et al. ............... 714/15
6,549,235 B1 * 4/2003 Fossum et al. ............. 348/308
6,606,122 B1 * 8/2003 Shaw et al. ................. 348/302
2002/0132041 A1 * 9/2002 Yamanobe et al. ........... 427/77

FOREIGN PATENT DOCUMENTS

JP 401211733 A * 8/1989 .................. 345/87

OTHER PUBLICATIONS

Ackland; Camera on a chip;IEEE,8–10 Ref. 1996; pp. 22–26.*
Fossum et al.; Digital Camera system on a chip (IEEE).*
Making Ferro–electric memories; Domokos Hadnagy (American Institute of Physics).*

* cited by examiner

*Primary Examiner*—Andrew Christensen
*Assistant Examiner*—Yogesh Aggarwal
(74) *Attorney, Agent, or Firm*—Rabin & Berdo, P.C.

(57) ABSTRACT

A light-electricity converting apparatus having a light-electricity converting device and a non-volatile storage device connected to the light-electricity converting device. The light-electricity converting device may be a photosensitive device for generating an electric signal in response to light. The non-volatile storage device may store the electric signal generated by the photosensitive device. Further, the light-electricity converting device may be a light emitting device for converting an electric signal into light. In this case, the non-volatile storage device may store the electric signal to be fed to the light emitting device.

28 Claims, 6 Drawing Sheets

10
11 12 25 26 24 22
19 23 21
18 17 S D
N N
14 16 P 13
SUB
DRIVING CIRCUIT 28
CONTROL CIRCUIT 29

FIG. 6 ( a )
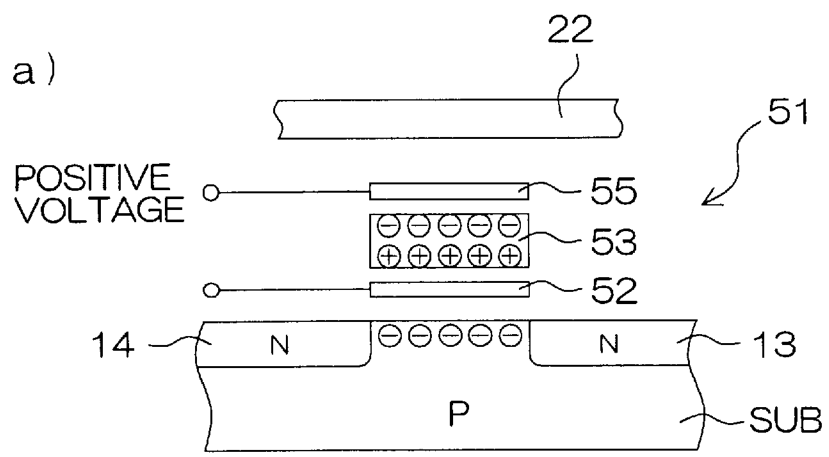
FIG. 6 ( b )
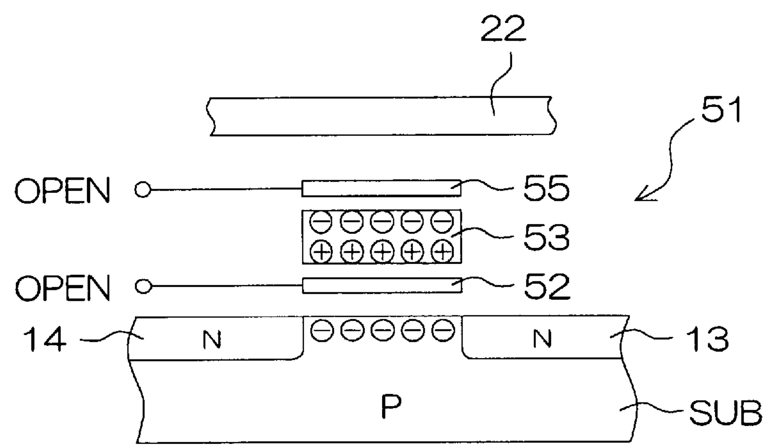
FIG. 6 ( c )
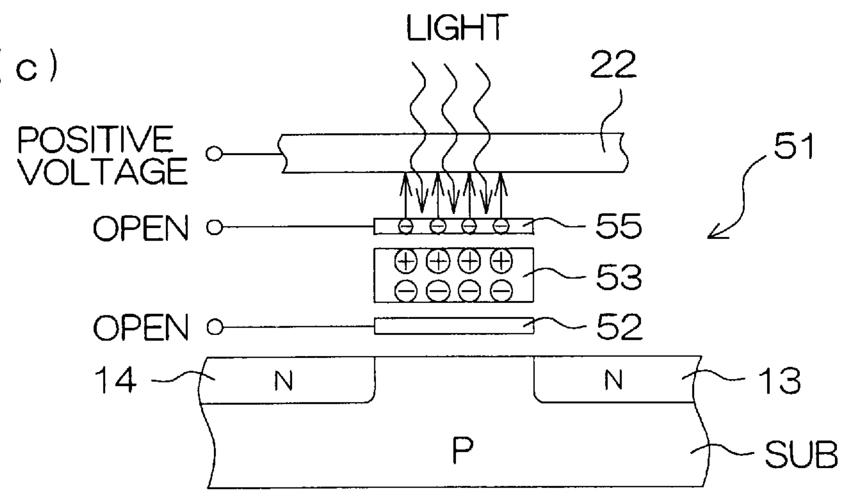

LIGHT-ELECTRICITY CONVERTING APPARATUS USING NON-VOLATILE MEMORY AND IMAGE APPARATUS USING THE SAME

BACKGROUND OF THE INVENTION

1. Field of the Invention

The present invention relates to a light-electricity converting apparatus which can be used for imaging, storing, or displaying an image, for example, and an image apparatus using the same.

2. Description of Related Art

Image pick-up devices such as a CCD (Charge Coupled Device) image sensor have been conventionally used for picking up images. Further, display devices such as a CRT (Cathode-Ray Tube), a liquid crystal display panel, and a plasma display panel have been conventionally used for displaying the images. For example, in order to perform image processing such as processing for processing a picked-up image and image communication processing for transmitting data representing the picked-up image, it is necessary to convert an image signal into image data once, and store the image data in a memory. In order to perform image processing, therefore, an image pick-up device and a storage device (memory) for image data storage are required. Further, to display the image, an image display device is also required. Typical examples of an apparatus comprising the three devices are a digital camera and a TV telephone set.

Therefore, miniaturization of the above-mentioned three constituent elements is the key to miniaturize image equipment represented by the digital camera and the TV telephone set.

SUMMARY OF THE INVENTION

An object of the present invention is to provide a light-electricity converting apparatus capable of contributing to miniaturization of image equipment and an image apparatus using the same.

A light-electricity converting apparatus according to the present invention comprises a light-electricity converting device and a non-volatile storage device connected to the light-electricity converting device.

According to the above-mentioned construction, it is possible to convert a light signal into an electric signal by the light-electricity converting device to store the electric signal in the non-volatile storage device, and read out the electric signal stored in the non-volatile storage device to convert the electric signal into a light signal by the light-electricity converting device.

Specifically, the light-electricity converting device may be a photosensitive device for generating an electric signal in response to light. Further, it may be a light emitting device for converting an electric signal into light. The light-electric converting device may have both a photosensitive device function and a light emitting device function.

Specifically, the light-electricity converting device may comprise an emitter electrode connected to an electrode of the non-volatile storage device for emitting electrons.

According to the construction, it is possible to perform a light emitting operation utilizing the emission of electrons from the emitter electrode. For example, light may be emitted by exciting a fluorescent substance using the electrons emitted from the emitter electrode or generating gas plasma using the electrons emitted from the emitter electrode.

If the emitter electrode can emit electrons by irradiating electromagnetic waves, the electrons are emitted by irradiating light (electromagnetic waves). Consequently, it is possible to convert a light signal into an electric signal and write the electric signal into the non-volatile storage device.

The non-volatile storage device may be a device which is rewritable utilizing a photoelectric effect. That is, it may be one capable of erasing written information by irradiating ultraviolet rays and storing new information. If the photoelectric effect can be produced by visible light, the non-volatile storage device itself can be also used as a photosensitive device.

An image apparatus according to the present invention is constructed by arranging a plurality of pixels each comprising the light-electricity converting apparatus having the above-mentioned features.

In this case, the pixels each comprising the light-electricity converting apparatus may be arranged in a one-dimensional manner or a two-dimensional manner.

By this construction, it is possible to pick up and store an image and reproduce (display) the stored image. Consequently, the image pick-up device, the storage device, and the display device are integrated as one solid device. Accordingly, it is possible to miniaturize image equipment including the three devices as constituent elements.

In order to pick up an image, it is preferable that the image apparatus further comprises an imaging control circuit for causing the plurality of pixels to perform an imaging operation for picking up the image.

Further, in order to display an image, it is preferable that the image apparatus further comprises a display control circuit for causing the plurality of pixels to perform a displaying operation for displaying an image.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6(*a*), 6(*b*) and 6(*c*) are diagrams for explaining an image writing operation in the apparatus shown in FIG. 5.

DESCRIPTION OF THE PREFERRED EMBODIMENTS

Figure 1:
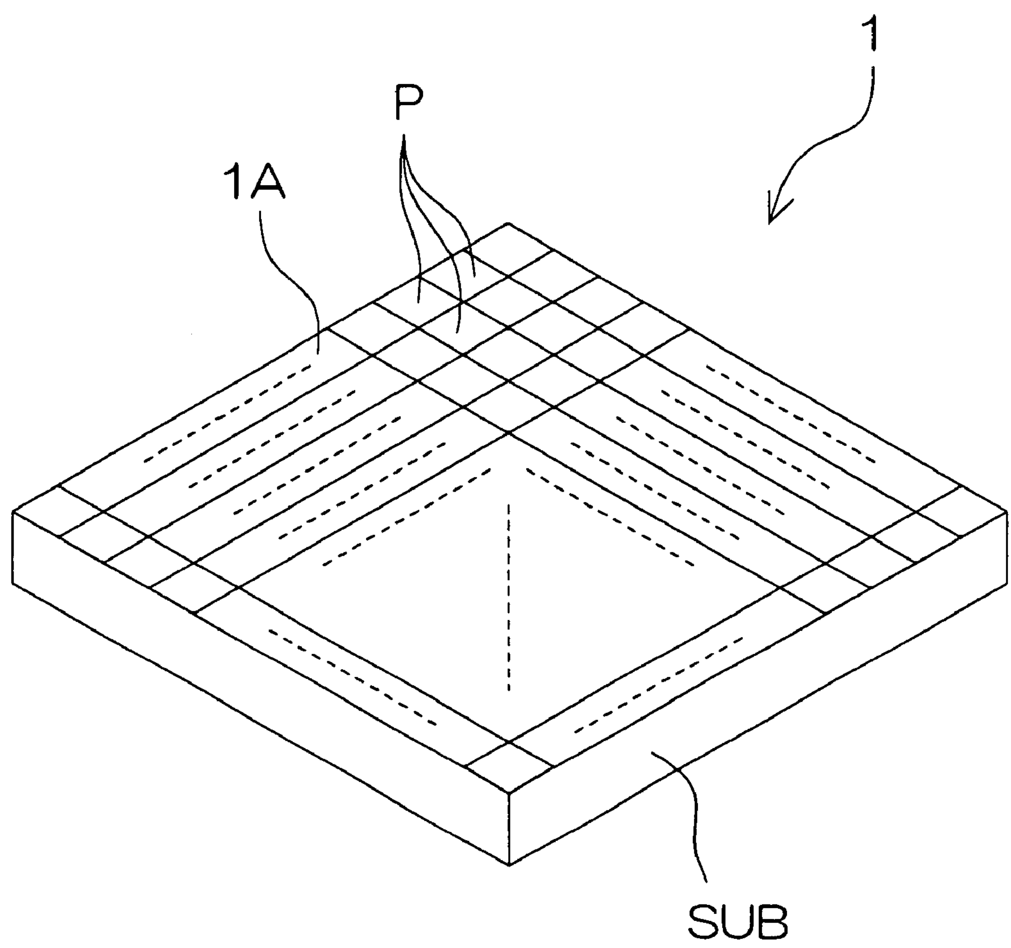
FIG. 1 is a schematic perspective view of an image apparatus according to an embodiment of the present invention.

FIG. 1 is a schematic perspective view of an image apparatus according to an embodiment of the present invention. An image apparatus 1 is a single solid device produced by a semiconductor process, and has a plurality of pixels P formed in a matrix arrangement on a substrate SUB. Each of the pixels P has a light-electricity converting function for converting a light signal and an electric signal into each other and a non-volatile storing function for storing the electric signal in a non-volatile manner. Consequently, the image apparatus itself has three functions as an image pick-up device for picking up an image, a storage device for storing an electric signal representing the image, and a display device for reproducing the stored image.

Figure 2:
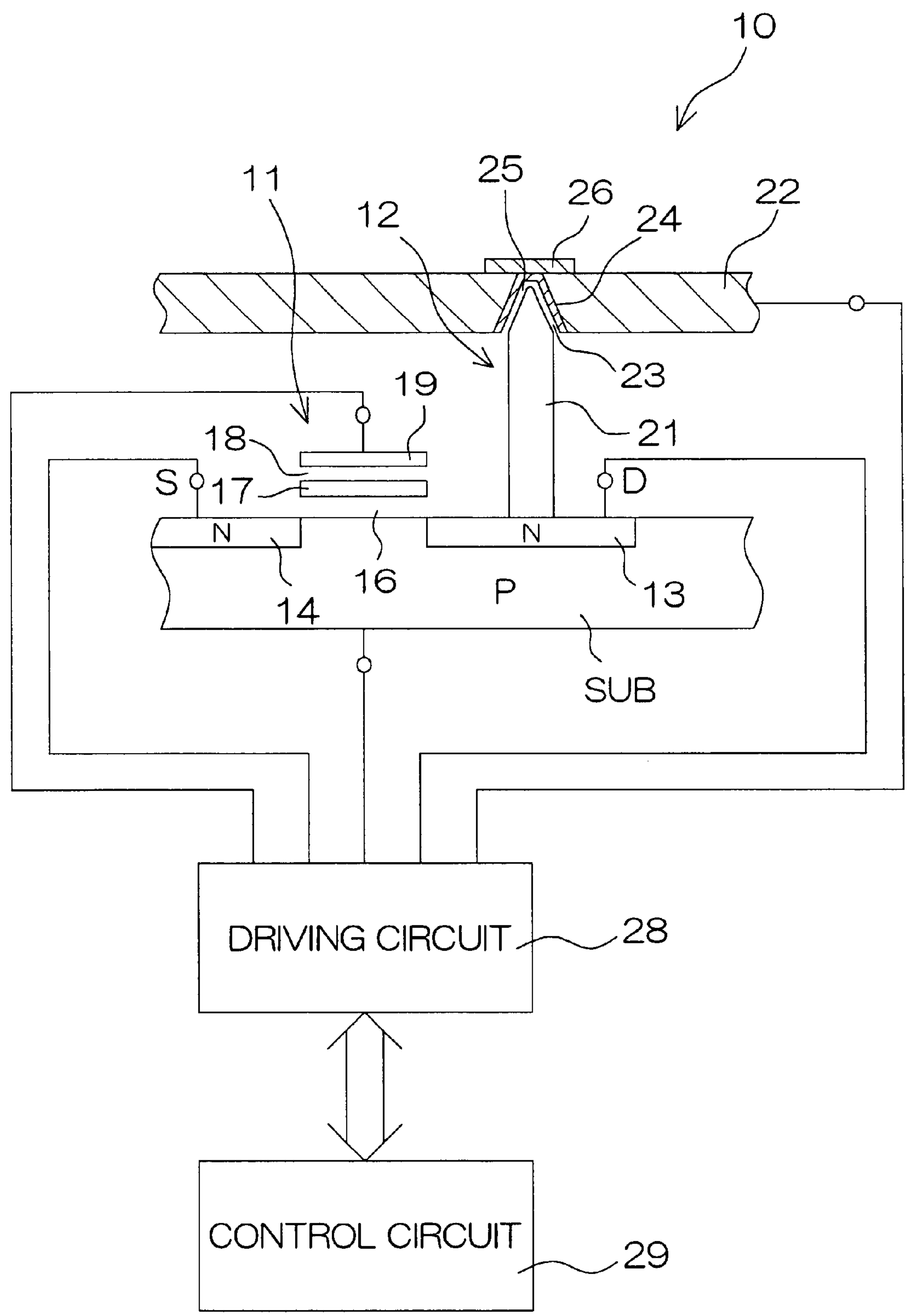
FIG. 2 is a cross-sectional view showing the fundamental construction of a light-electricity converting apparatus according to a first embodiment which can constitute a pixel in the image apparatus.

FIG. 2 is a cross-sectional view showing the fundamental construction of a light-electricity converting apparatus 10 according to a first embodiment which can constitute the pixel P. The light-electricity converting apparatus 10 comprises a floating gate type FET (Field Effect Transistor) device 11 serving as a non-volatile storage device and an FEC (Field Emission Cathode) device 12 connected to the FET device 11.

The FET device 11 comprises an N-type drain impurity region 13 and an N-type source impurity region 14 which are spaced apart from each other on a surface layer region of a P-type semiconductor substrate SUB, a floating gate 17 provided through a gate insulating film 16 on the semiconductor substrate SUB therebetween, and a control gate 19 stacked over the floating gate 17 through an insulating film 18.

On the other hand, the FEC device 12 comprises an emitter electrode 21 provided in a standing posture on the semiconductor substrate SUB in a state where it is joined to the drain region 13, a collector electrode 22 opposite to the emitter electrode 21 with a clearance 23 provided therebetween, and a fluorescent layer 24 provided on a surface, opposite to the emitter electrode 21, of the collector electrode 22. A front end of the emitter electrode 21 is formed in a cone shape. Correspondingly, a cone-shaped opening 25 is formed in an area, opposite to the emitter electrode 21, of the collector electrode 22. The opening 25 is closed by a filter 26 on the opposite side of the emitter electrode 21. The fluorescent layer 24 is provided on an inner wall surface of the opening 25 and a surface, opposite to the emitter electrode 21, of the filter 26.

The emitter electrode 21 is composed of a material which can emit electrons, for example, polysilicon, diamond, or a carbon nanotube. When the emitter electrode 21 is composed of polysilicon, it is preferable that a metal (Ni, Au, Mo, W, etc.) is made to adhere to the front end in the cone shape.

The FEC device 12 can emit field emission electrons to the clearance 23 by applying a suitable voltage between the emitter electrode 21 and the collector electrode 22. That is, the electrons are emitted from the emitter electrode 21 to the collector electrode 22. The electrons collide with and excite the fluorescent layer 24. Consequently, light is emitted. This is an operation as a light emitting device of the FEC device 12.

On the other hand, when light is irradiated onto a portion between the emitter electrode 21 and the collector electrode 22 through the filter 26 in a state where a voltage slightly lower than a voltage at which field emission electrons are emitted is applied, electrons which have derived energy from the light are emitted from the emitter electrode 21, and are directed toward the collector electrode 22. Thus, the FEC device 12 can also have a function as a photosensitive device for converting a light signal into an electric signal.

On the other hand, the FET device 11 can assume a "0" state where electrons are stored in the floating gate 17 and a "1" state where no electrons are stored in the floating gate 17. A threshold value of a voltage to be applied to the control gate 19 in order to form a channel between a source S and a drain D of the FET device 11 takes a first value which is relatively high in the "0" state, while taking a second value which is relatively low in the "1" state. When a voltage (for example, +5 V) taking an intermediate value between the first and second values is applied to the control gate 19, it is possible to detect whether or not the FET device 11 is in the "0" state or the "1" state depending on whether the FET device 11 is rendered conductive. The floating gate 17 is in an electrically floating state. Even if power is not supplied thereto, therefore, the "0" state or the "1" state is held. Accordingly, the FET device 11 can store information in a non-volatile manner.

The information is written into the FET device 11 by injecting the electrons into the floating gate 17. The electrons can be injected into the floating gate 17 by injecting hot electrons or FN (Fowler-Nordheim) tunneling.

In the case of the injection of hot electrons, a high voltage of +SUB V is applied to the drain D, a high voltage of +12 V is applied to the control gate 19, and the source S is set to 0 V, for example. Consequently, the electrons directed from the source region 14 to the drain region 13 are scattered in the vicinity of the drain region 13, are attracted to the control gate 19 to which the high voltage is applied, and are captured by the floating gate 17.

In the case of the FN tunneling, a voltage of −5 V is applied to the semiconductor substrate SUB, and a high voltage of +12 V is applied to the control gate 19, for example. Consequently, the electrons in the semiconductor substrate SUB are injected into the floating gate 17 upon passing through the gate insulating film 16 by the tunneling effect.

The information written into the FET device 11 is erased by emitting the electrons from the floating gate 17. The electrons are emitted from the floating gate 17 by FN tunneling or ultraviolet erasure.

In a case where the FN tunneling is utilized, a negative voltage of −12 V is applied to the control gate 19, and 5 V is applied to the semiconductor substrate SUB, for example. Consequently, the electrons stored in the floating gate 17 tunnel the gate insulating film 16 by the tunneling effect, and are emitted to the semiconductor substrate SUB.

In a case where the ultraviolet erasure is utilized, the floating gate 17 is provided with a window capable of introducing ultraviolet rays from an external light source. The floating gate 17 is irradiated with the ultraviolet rays, so that energy is applied to the electrons captured by the floating gate 17. The electrons are introduced into the semiconductor substrate SUB upon passing through the gate insulating film 16.

The information stored in the FET device 11 is read out in the following manner. That is, a voltage of +5 V is applied to the control gate 19, the source S is set to 0 V, and a voltage of 12 V is applied to the drain D. It is examined whether or not the FET device 11 is rendered conductive depending on whether or not a voltage drop at the drain D is observed. If the FET device 11 is rendered conductive, the "1" state is read out. If the FET device 11 is in an OFF state, the "0" state is read out.

In storing an image, the electrons are first injected into the floating gates 17 of the FET devices 11 in all the pixels P, so that all the pixels P are brought into the "0" state. Thereafter, the source S is brought into a ground potential, or a negative voltage is applied thereto. A negative voltage is applied to the control gate 19. The drain D is opened. Further, a voltage slightly lower than a voltage at which field electrons are emitted from the emitter electrode 21 is applied to the collector electrode 22. In such a state, when an image to be picked up is presented to an imaging/display surface 1A (see FIG. 1) of the image apparatus 1, the electrons are emitted from the emitter electrode 21 in each of the pixels P depending on an amount of light received from the image. At this time, the negative voltage is applied to the control gate 19, so that the electrons stored in the floating gate 17 are in a state where they are easily emitted. Accordingly, the electrons are emitted from the floating gate 17 depending on the emission of the field electrons from the emitter electrode 21. Consequently, the FET device 11 in each of the pixels P assumes the "0" state or the "1" state depending on the contents of the image. Therefore, imaging and storage of the image are simultaneously achieved.

The image thus stored can be read out as image data from the image apparatus 1, and can be also processed or transmitted by data communication through a communication line (wire or radio). In order to process the image data on the image apparatus 1, the image data may be read out for each of the pixels P and processed, and the processed data may be written again into the pixel P.

In displaying the image, a reading voltage of 5 V is applied to the control gate 19, the source S is set to 0 V, and the drain D is opened. A positive voltage at which field electrons can be emitted is applied to the collector electrode 22. Consequently, in the pixel P in the "1" state, the emitter electrode 21 emits electrons by being supplied with the electrons from the source S. Contrary to this, in the pixel P in the "0" state, the emitter electrode 21 does not emit electrons because it cannot be supplied with the electrons. Therefore, each of the pixels P is lighted up or extinguished depending on the state of the FET device 11. Consequently, the image can be displayed.

The display of the image is merely a reading operation in a state where a positive voltage at which field electrons are emitted is applied to the collector electrode 22. Consequently, the image data can be read out while displaying the image or in a state where the display of the image is stopped.

A moving image can be displayed by repeating the writing and erasure in pixel units.

The voltage is applied, as described above, to the source S, the drain D, the control gate 19, the substrate SUB, and the collector 22 by a driving circuit 28. The driving circuit 28 is controlled by a control circuit 29 depending on a required operation. In this case, the control circuit 29 corresponds to an imaging control circuit and a display control circuit.

The control circuit 29 controls the operation of each of the pixels P in order to realize a displaying operation for displaying an image for the pixel P, a writing operation for storing image data in the pixel P, an image reading operation for reading out the image data from the pixel P, and an image erasing operation for erasing the image data in the pixel P. Consequently, the control circuit 29 reads out the image data in selected one of a first mode in which the reading of the image is performed while displaying the image and a second mode in which the reading of the image is performed with the display of the image stopped. The selection of the mode may be able to be set by a user. Further, the control circuit 29 also has the function of realizing the display of the moving image by repeatedly writing and erasing the image data to each of the pixels P.

According to the present embodiment, the FET device 11 having the floating gate 17 and the FEC device 12 are thus connected to each other to constitute the pixel P. The image apparatus 1 having the pixels P can achieve an imaging function, an image storing function, and an image displaying function. Consequently, image equipment such as a digital camera or a TV telephone set can be significantly miniaturized. For example, a portable TV telephone set can be realized by a light-weight and small-sized structure.

Figure 3:
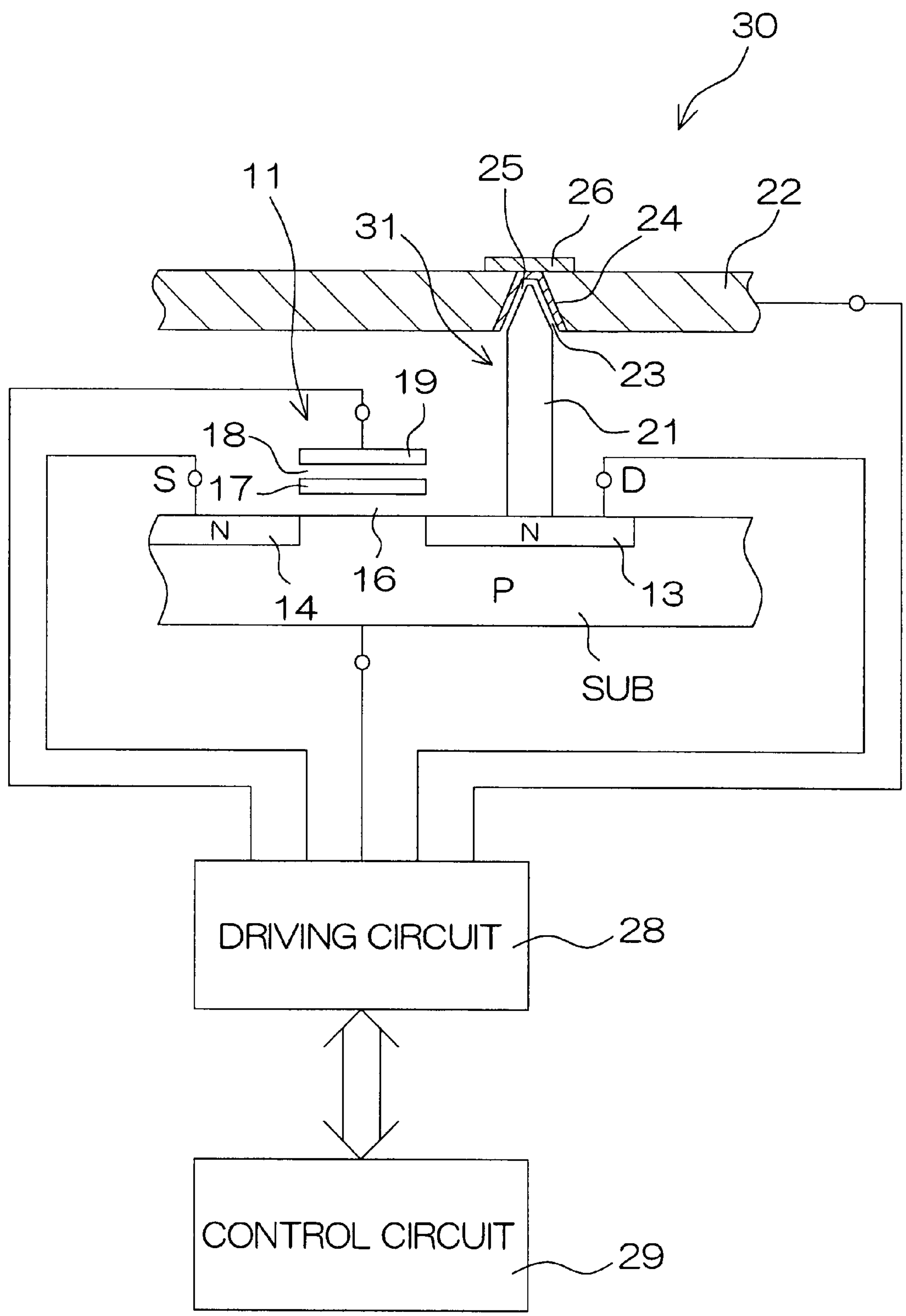
FIG. 3 is a cross-sectional view showing the fundamental construction of a light-electricity converting apparatus according to a second embodiment of the present invention.

FIG. 3 is a cross-sectional view showing the fundamental construction of a light-electricity converting apparatus 30 according to a second embodiment of the present invention. The light-electricity converting apparatus 30 can constitute each of the pixels P in the image apparatus 1 shown in FIG. 1 in place of the light-electricity converting apparatus 10 shown in FIG. 2. In FIG. 3, the same portions as the portions shown in FIG. 2 are assigned the same reference numerals as those shown in FIG. 2, and the overlapped description will be omitted as much as possible.

The light-electricity converting apparatus 30 comprises a plasma device 31 and a floating gate type FEC device 11. The structure of the plasma device 31 is similar to the structure of the above-mentioned FEC device 12, and comprises an emitter electrode 21 having its front end in a cone shape and a collector electrode 22 having an opening 25 in a cone shape corresponding thereto. Neon-xenon gas or the like is sealed in a clearance 23. Ultraviolet rays are emitted by discharge between the emitter electrode 21 and the collector electrode 22. The ultraviolet rays are irradiated onto a fluorescent layer 24, thereby emitting light. Various operations such as storage, reading and erasure of an image are approximately the same as those in the case of the light-electricity converting apparatus 10 shown in FIG. 2.

Figure 4:
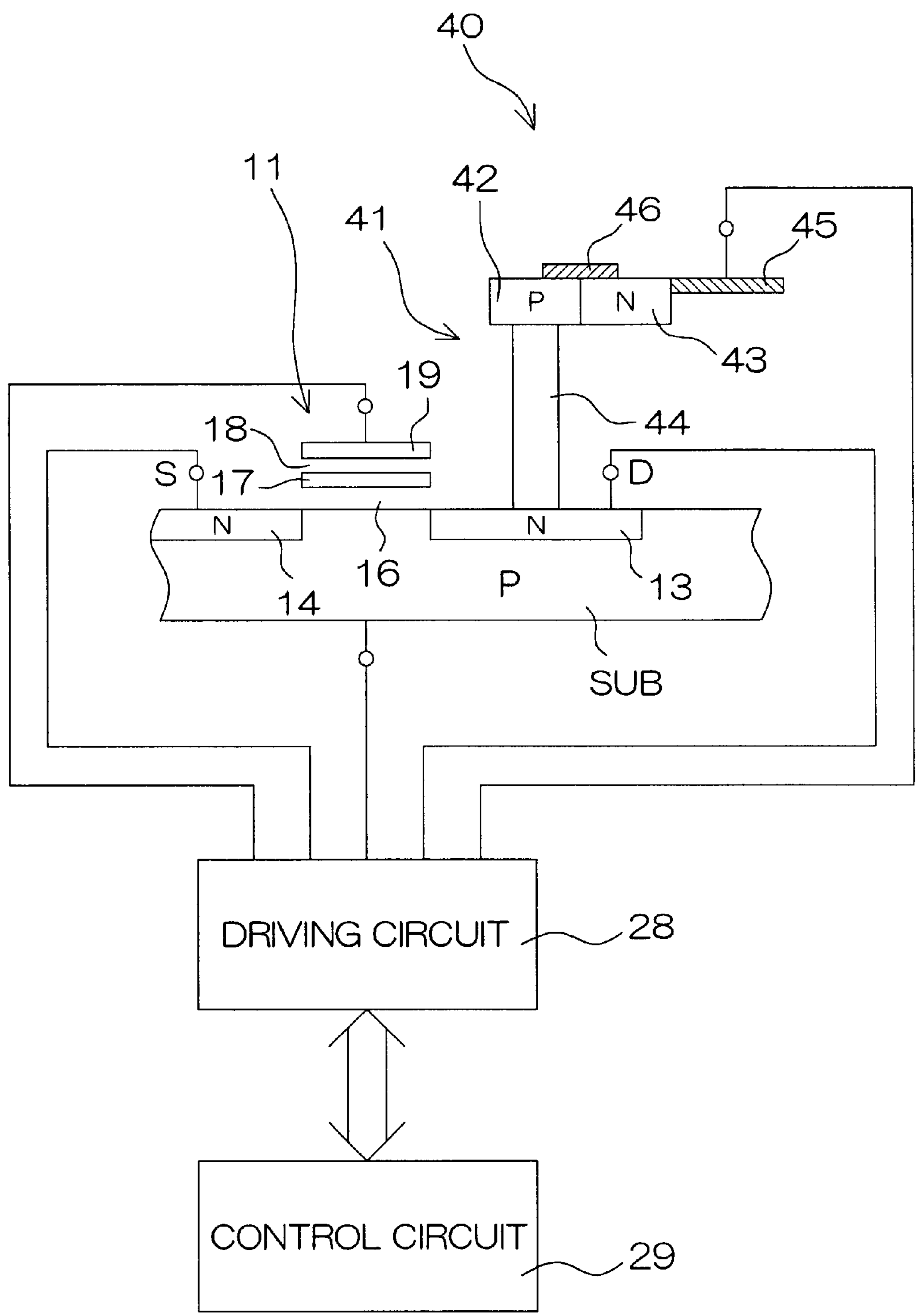
FIG. 4 is a cross-sectional view showing the fundamental construction of a light-electricity converting apparatus according to a third embodiment of the present invention.

FIG. 4 is a cross-sectional view showing the fundamental construction of a light-electricity converting apparatus 40 according to a third embodiment of the present invention. The light-electricity converting apparatus 40 can constitute each of the pixels P in the image apparatus 1 shown in FIG. 1 in place of the light-electricity converting apparatus 10 shown in FIG. 2. In FIG. 4, the same portions as the portions shown in FIG. 2 are assigned the same reference numerals as those shown in FIG. 2, and the overlapped description shall be omitted as much as possible.

The light-electricity converting apparatus 40 comprises a photodiode device 41 and a floating gate type FET device 11. The photodiode 41 comprises a P-type semiconductor portion 42, an N-type semiconductor portion 43 joined thereto, a plug 44 for connecting the N-type semiconductor portion 42 to a drain region 13 of the FET device 11, and a cathode electrode 45 connected to the N-type semiconductor portion 43. A photosensitive band 46 is arranged on a surface of a PN junction in the boundary between the P-type semiconductor portion 42 and the N-type semiconductor portion 43.

A suitable voltage is applied to the cathode electrode 45 or the like, to apply a reverse bias to the PN junction. When light is applied to the photosensitive band 46 in this state, holes and electrons are generated in the vicinity of the PN junction. A light signal is thus converted into an electric signal.

When a suitable forward bias is applied to the PN junction, light is emitted by recombination of the holes and the electrons. The electric signal is thus converted into the light signal.

In storing an image, electrons are first injected into floating gates 17 of the FET devices 11 in all the pixels P, so that all the pixels P are brought into a "0" state, as in the case of the light-electricity converting apparatus 10 shown in FIG. 2. Thereafter, a source S is brought into a ground potential, or a negative voltage is applied thereto. A negative voltage is applied to a control gate 19. A drain D is opened. Further, a positive voltage is applied to the cathode electrode 45, and a reverse bias slightly lower than a breakdown voltage is applied to the PN junction of the photodiode device 41.

When an image to be picked up is presented to the imaging/display surface 1A of the image apparatus 1, pairs of holes and electrons are generated in each of the pixels P depending on an amount of light received from the image. Positive charges are therefore supplied to the drain region 13. At this time, a negative voltage is applied to the control gate 19, so that the electrons stored in the floating gate 17 are in a state where they are easily emitted. Accordingly, the electrons are emitted from the floating gate 17 depending on the supply of the positive charges from the photodiode device 41. Consequently, the FET device 11 in each of the pixels P assumes a "0" state or a "1" state depending on the contents of the image. Therefore, imaging and storage of the image are simultaneously achieved.

On the other hand, in displaying the image, a reading voltage of 5 V is applied to the control gate 19, a suitable positive voltage is applied to the source S, and the drain D is opened. A suitable voltage (for example, 0 V) capable of rendering the PN junction conductive is applied to the cathode electrode 45 in a relationship with the voltage applied to the source S. Consequently, in the pixel P in the "1" state, a portion between the source S and the drain D is rendered conductive, so that a current is supplied to the PN junction. Accordingly, light is emitted. Contrary to this, in the pixel P in the "0" state, no current is supplied to the PN junction. Accordingly, light is not emitted. Therefore, each of the pixels 11 is lighted up or extinguished depending on the state of the FET device 11. Consequently, the image can be displayed.

The voltage is applied, as described above, to the source S, the drain D, the control gate 19, the substrate SUB, and the cathode electrode 45 under control of a control circuit 29 by a driving circuit 28.

Figure 5:
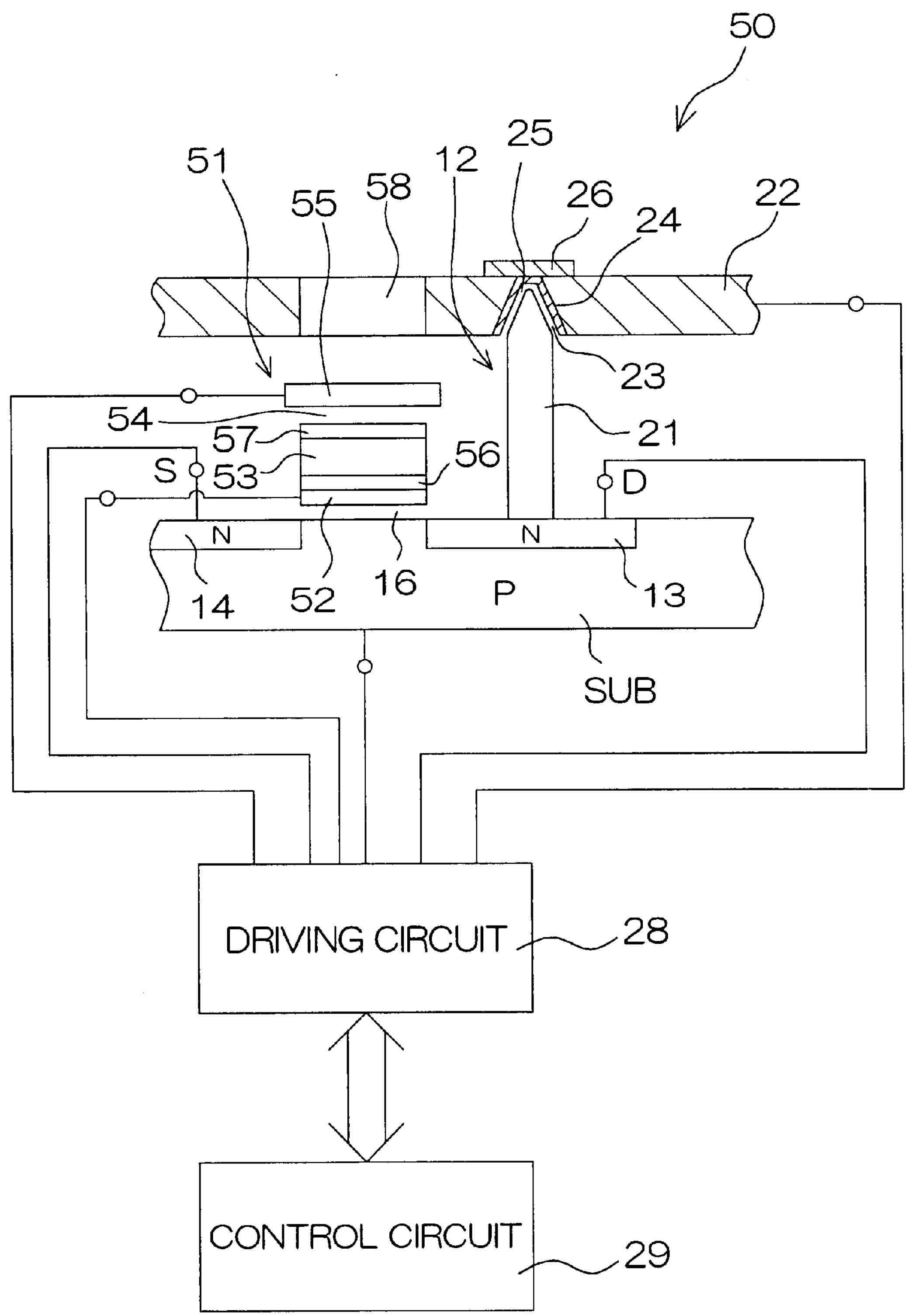
FIG. 5 is a cross-sectional view showing the fundamental construction of a light-electricity converting apparatus according to a fourth embodiment of the present invention.

FIG. 5 is a cross-sectional view showing the fundamental construction of a light-electricity converting apparatus 50 according to a fourth embodiment of the present invention. The light-electricity converting apparatus 50 can constitute each of the pixels P in the image apparatus 1 shown in FIG. 1 in place of the light-electricity converting apparatus 10 shown in FIG. 2. In FIG. 5, the same portions as the portions shown in FIG. 2 are assigned the same reference numerals as those shown in FIG. 2, and the overlapped description will be omitted as much as possible.

The light-electricity converting apparatus 50 comprises a non-volatile ferroelectric storage device 51 and an FEC device 12. The storage device 51 has a gate electrode 52 provided on a semiconductor substrate SUB between a source region 14 and a drain region 13 with a gate insulating film 16 interposed therebetween, a ferroelectric film 53 provided on the gate electrode 52, and a control gate 55 provided over the ferroelectric film 53 through an insulating film 54. Barrier metal films 56 and 57 are respectively provided on upper and lower surfaces of the ferroelectric film 53.

An opening 58 corresponding to the ferroelectric film 53 is formed in a collector electrode 22, so that light from the exterior can be incident on the ferroelectric film 53. The opening 58 is provided for each of the pixels P.

The ferroelectric film 53 may be composed of PZT ($Pb(Zr,Ti)O_3$), PLZT ($(Pb,La)(Zr,Ti)O_3$), or the like, and has the property of causing polarization by applying an electric field and still causing residual polarization even if the electric field is removed. Even after the electric field is removed, information can be stored utilizing the residual polarization. Consequently, nonvolatile storage is possible.

FIGS. 6(*a*), 6(*b*), and 6(*c*) illustrate a writing operation. Specifically, as shown in FIG. 6(*a*), a positive high voltage is applied to the control gate 55, and 0 V is applied to the gate 52, for example. Consequently, polarization which is negative on the side of the control gate 55 occurs in the ferroelectric film 53, as shown in FIG. 6(*a*). The polarization remains even after the application of the voltage to the control gate 55 is stopped.

From this state, both the control gate 55 and the gate 52 are electrically opened, as shown in FIG. 6(*b*).

When light is applied to the ferroelectric film 53 through the opening 58 (see FIG. 5) in a state where a positive voltage is applied to the collector electrode 22, as shown in FIG. 6(*c*), electrons are moved from the barrier metal film 57 to the collector electrode 22 by a photoelectric effect. Consequently, the polarization in the ferroelectric film 53 is inverted.

Consequently, the steps shown in FIGS. 6(*a*) and 6(*b*) are carried out with respect to all the pixels P. Thereafter, when the imaging/display surface 1A of the image apparatus 1 is presented to an image to be picked up with the positive voltage applied to the collector electrode 22, the polarization is inverted, as shown in FIG. 6(*c*), in the certain pixel, while not being inverted in the other pixels depending on the contents of the image. Therefore, imaging and storage of the image are simultaneously achieved.

In displaying the image, a predetermined reading voltage is applied to the control gate 55, a source S is set to 0 V, and a drain D is opened. A reading voltage is set to a value at which no channel can be formed between the source and the drain in the polarized state shown in FIG. 6(*b*), while a channel can be formed between the source and the drain in the polarized state shown in FIG. 6(*c*).

In this state, a positive voltage at which field electrons can be emitted is applied to the collector electrode 22. Consequently, in the pixel P in the "1" state (the state shown in FIG. 6(*c*)), the emitter electrode 21 emits electrons by being supplied with the electrons from the source S. Contrary to this, in the pixel P in the "0" state (the state shown in FIG. 6(*b*)), the emitter electrode 21 does not emit electrons because it cannot be supplied with the electrons. Therefore, each of the pixels P is lighted up or extinguished depending on the state of the storage device 51. Consequently, the image can be displayed.

The display of the image is merely a reading operation in a state where a positive voltage at which field electrons are emitted is applied to the collector electrode 22. Consequently, the image data can be read out while displaying the image or in a state where the display of the image is stopped.

The voltage is applied, as described above, to the source S, the drain D, the gate 52, the control gate 55, the substrate SUB, and the collector electrode 22 under control of a control circuit 29 by a driving circuit 28.

Although description has been made of the four embodiments of the present invention, the present invention can be also embodied in another way. For example, it is also possible to employ, as a photosensitive/light emitting device, a device in another form, for example, an EL device in addition to the FEC device, the plasma device, and the photodiode device, as described above. Although in the above-mentioned embodiment, the floating gate type FET device and the non-volatile storage device using ferroelectrics are taken as examples of the non-volatile storage device, various types of non-volatile storage devices used in a non-volatile storage such as an EPROM (Erasable Programmable Read Only Memory), an EEPROM (Electrically Erasable and Programmable ROM), and a flash memory are applicable in addition thereto.

The non-volatile ferroelectric storage device 51 having the structure shown in FIG. 5 can be used in combination with each of the photosensitive/light emitting devices shown in FIGS. 2 to 4.

Although the present invention has been described and illustrated in detail, it is clearly understood that the same is by way of illustration and example only and is not to be taken by way of limitation, the spirit and scope of the present invention being limited only by the terms of the appended claims.

The application is based on Japanese Patent Application Serial No. 11-281946 filed with the Japanese Patent Office on Oct. 1, 1999, the disclosure of which is incorporated hereinto by reference.

What is claimed is:

1. A light-electricity converting apparatus, comprising:

a light-electricity converting device; and a non-volatile transistor storage device connected to the light-electricity converting device, wherein said light-electricity converting device is a single device having both a photosensitive device function for generating an electric signal in response to light and a light emitting device function for converting the electric signal into light, and said non-volatile storage device is connected to said light-electricity converting device such that it can store the electric signal generated by said light-electricity converting device and feed the stored electric signal to said light-electricity converting device.

2. The light-electricity converting apparatus according to claim 1, wherein said light-electricity converting device includes an emitter electrode, connected to an electrode of said non-volatile storage device, for emitting electrons.

3. The light-electricity converting apparatus according to claim 2, wherein said emitter electrode can emit electrons in response to irradiating electromagnetic waves.

4. The light-electricity converting apparatus according to claim 1, wherein said light-electricity converting device is an FEC (Field Emission Cathode) device comprising a emitter electrode having a cone-shaped emitting surface, a collector electrode disposed opposite the emitter electrode with a space therebetween, and a fluorescent layer provided on a surface of the collector electrode opposite the emitter electrode.

5. The light-electricity converting apparatus according to claim 1, wherein said light-electricity converting device is a plasma device comprising an emitter electrode, connected to an electrode of said non-volatile storage device, a collector electrode disposed opposite the emitter electrode, with a space therebetween filled with one or more inert gases, and a fluorescent layer provided on a surface of the collector electrode opposite the emitter electrode.

6. The light-electricity converting apparatus according to claim 1, wherein said light-electricity converting device is a photodiode device comprising a P-type semiconductor portion and an N-type semiconductor portion, and having a photosensitive band arranged on a surface of the device at a junction between the P-type semiconductor portion and the N-type semiconductor portion.

7. The light-electricity converting apparatus according to claim 1, wherein said non-volatile storage device is a device which is rewritable utilizing a photoelectric effect.

8. The light-electricity converting apparatus according to claim 7, wherein the non-volatile storage device can produce the photoelectric effect by visible light.

9. The light-electricity converting apparatus according to claim 1, wherein said non-volatile storage device is a floating gate type FET device.

10. The light-electricity converting apparatus according to claim 1, wherein said non-volatile storage device is a non-volatile storage device using ferroelectrics.

11. An image apparatus having a plurality of pixels arranged thereon, wherein each of the pixels comprises a light-electricity converting device and a non-volatile transistor storage device connected to the light-electricity converting device, wherein said light-electricity converting device is a single device having both a photosensitive device function for generating an electric signal in response to light and a light emitting device function for converting the electric signal into light, and wherein said non-volatile storage device is connected to said light-electricity converting device such that it can store the electric signal generated by said light-electricity converting device and feed the stored electric signal to said light-electricity converting device.

12. The image apparatus according to claim 11, wherein said light-electricity converting device includes an emitter electrode, connected to an electrode of said non-volatile storage device, for emitting electrons.

13. The image apparatus according to claim 12, wherein said emitter electrode can emit electrons in response to irradiating electromagnetic waves.

14. The image apparatus according to claim 11, wherein said non-volatile storage device is a device which is rewritable utilizing a photoelectric effect.

15. The image apparatus according to claim 11, wherein said plurality of pixels are arranged in a one-dimensional manner or a two-dimensional manner.

16. The image apparatus according to claim 11, further comprising:

a control circuit for controlling the light-electricity converting device and the non-volatile storage device in each of said pixels in order to have a function of picking up an image, a function of storing an electric signal representing the image, and a function of displaying the stored image.

17. The image apparatus according to claim 11, further comprising:

an imaging control circuit for causing said plurality of pixels to perform an imaging operation for picking up an image.

18. The image apparatus according to claim 11, further comprising:

a display control circuit for causing said plurality of pixels to perform a displaying operation for displaying an image.

19. The image apparatus according to claim 11, further comprising:

an imaging control circuit for causing said plurality of pixels to perform an imaging operation for picking up an image, and a display control circuit for causing said plurality of pixels to perform a displaying operation for displaying an image.

20. The image apparatus according to claim 11, further comprising:

a control circuit for controlling the light-electricity converting device and the non-volatile storage device in each of said plurality of pixels in order to perform a displaying operation for causing said pixels to display an image and a reading operation for reading out image data stored in said pixels, the control circuit simultaneously performing the reading of the image data and the display of the image.

21. The image apparatus according to claim 11, further comprising:

a control circuit for controlling the light-electricity converting device and the non-volatile storage device in each of said plurality of pixels in order to perform a displaying operation for causing said pixels to display an image and a reading operation for reading out image data stored in said pixels, the control circuit performing the reading of the image data with the display of the image stopped.

22. The image apparatus according to claim 11, further comprising:

a control circuit for controlling the light-electricity converting device and the non-volatile storage device in each of said plurality of pixels in order to perform a displaying operation for causing said pixels to display an image and a reading operation for reading out image data stored in said pixels, the control circuit reading out the image data in accordance with a selected one of a first mode in which the reading of the image is performed simultaneously with the display of the image and a second mode in which the reading of the image is performed with the display of the image stopped.

23. The image apparatus according to claim 11, further comprising:

a control circuit for controlling the light-electricity converting device and the non-volatile storage device in each of said plurality of pixels in order to perform a displaying operation for causing said pixels to display an image, a reading operation for reading out image data stored in said pixels, and an erasing operation for erasing the image data stored in said pixels, the control circuit displaying a moving image by repeating the writing and the erasure of the image data in pixel units.

24. The light-electricity converting apparatus according to claim 4, wherein for converting the electric signal to light, the emitter electrode emits electrons which collide with and excite the fluorescent layer, and to generate the electric signal from light, the emitter electrode emits electrons in response to the light which are directed to the collector electrode.

25. The light-electricity converting apparatus according to claim 5, wherein for converting the electric signal to light, the emitter electrode creates a discharge in the inert gases so as to cause the emission of ultraviolet rays to excite the fluorescent layer, and to generate the electric signal from light, the emitter electrode emits electrons in response to the light, which are directed to the collector electrode.

26. The light-electricity converting apparatus according to claim 6, wherein for converting the electric signal to light, the photodiode device is forward biased so as to cause light to be emitted by recombination of holes and electrons at the PN junction, and to generate the electric signal from light, the photodiode device is reverse biased so as to cause holes and electrons to be formed at the PN junction when the light is applied to the photosensitive band.

27. The light-electricity converting apparatus according to claim 1, wherein the light-electricity converting device and the non-volatile storage device are formed on a common substrate.

28. The image apparatus according to claim 11, wherein the light-electricity converting device and the non-volatile storage device for each of the plurality of pixels, are formed on a common substrate.

* * * * *